United States Patent [19]
Ootsuki

[11] Patent Number: 5,230,144
[45] Date of Patent: Jul. 27, 1993

[54] METHOD OF PRODUCING LEAD FRAME

[75] Inventor: Tetsuya Ootsuki, Nagano, Japan

[73] Assignee: Seiko Epson Corporation, Tokyo, Japan

[21] Appl. No.: 851,756

[22] Filed: Mar. 16, 1992

[30] Foreign Application Priority Data

Apr. 3, 1991 [JP] Japan .................................. 3-71132

[51] Int. Cl.⁵ .......................................... H01R 43/00
[52] U.S. Cl. .................................... 29/827; 437/220
[58] Field of Search .................... 29/827; 437/220; 174/52 FP

[56] References Cited

FOREIGN PATENT DOCUMENTS

| | | | |
|---|---|---|---|
| 56-83959 | 7/1981 | Japan | 29/827 |
| 59-87845 | 5/1984 | Japan | 29/827 |
| 63-128739 | 6/1988 | Japan | 437/220 |
| 2-209355 | 4/1990 | Japan | 437/220 |
| 2-244663 | 9/1990 | Japan | 437/220 |
| 2-284453 | 11/1990 | Japan | 437/220 |
| 3-6048 | 1/1991 | Japan | 437/220 |

Primary Examiner—Carl J. Arbes
Attorney, Agent, or Firm—Ladas & Parry

[57] ABSTRACT

A lead frame having inner leads which secures predetermined mechanical strength and which has no possibility of generation of twisting or the like through working, and a method of producing such a lead frame.

1 Claim, 15 Drawing Sheets

METHOD OF PRODUCING LEAD FRAME

BACKGROUND OF THE INVENTION

The present invention relates to a lead frame for a semiconductor device, and a method of producing the same.

A lead frame having a die-pad for mounting a semiconductor element thereon and inner leads for leading out electrodes of the semiconductor element has been widely used in a semiconductor device. In a semiconductor element mounted on such a lead frame die-pad, as shown in FIG. 1, electrodes 22 of a semiconductor element are respectively connected to corresponding inner leads 3 through wires 23. Recently, however, the number of the electrodes 22 of the semiconductor element 21 is so large that the pitch of the electrodes 22 is extremely narrow (generally, about 100-180 μm).

On the other hand, the inner leads 3 are formed of a lead frame material such as so-called 42-alloy through etching or punching, that is, using a punch press and referred to hereinafter as "press working". As shown in FIG. 2, generally, the width w of each of the inner leads 3 is selected to be within a range of from about 80 to 150 μm, the thickness t of the same is selected to be within a range of from about 100 to 300 μm, the pitch p of the inner leads is selected to be within a range of from about 150 to 250 μm, and the gap g between the inner leads is selected to be within a range of from about 70 to 170 μm.

In producing the inner leads 3, portions of the lead frame material corresponding to the gaps (g in FIG. 2) between the inner leads 3 are removed through etching or punched off through press working. In the case of etching, it takes much time because the thickness t of the lead frame material is so thick, and therefore the opposite side surfaces of each of the inner leads 3 are removed in a large arc as shown in FIG. 3, so that each of the inner leads 3 is formed in the shape like a hand drum to make the sectional area small. As a result, it is difficult to assure the mechanical strength of each inner lead 3 in the direction of its thickness, so that the inner lead 3 is often crushed or deformed when the wire 23 is bonded to the inner lead 3.

Further, in the case where the inner leads 3 are formed through press working there are defects as follows. That is, since the thickness t of each inner lead 3 is larger than the width w of the same, each inner lead 3 is twisted so that the gap between adjacent inner leads 3 is made wider (or narrower in a not-shown case) at their lower end sides as shown in FIG. 4 when the lead frame material is punched from its top by means of a downward press, while each inner lead 3 is twisted so that the gap between adjacent inner leads 3 is made narrower (or wider in a not-shown case) at their upper end sides as shown in FIG. 5 when the lead frame material is punched from its bottom by means of an upward press. Accordingly, sometimes, any of the wires 23 cannot come into perfect contact at it whole surface with the corresponding inner lead 3, resulting in defective connection.

SUMMARY OF THE INVENTION

It is therefore an object of the present invention to provide a lead frame having inner leads which secures predetermined mechanical strength and which has no possibility of generation of twisting or the like through working, and a method of producing such a lead frame.

According to one aspect of the present invention, the lead frame comprises a plurality of inner leads which are formed through twice or more times of etching, or press working or combination of etching and press working. Being formed in such a manner so as to have a predetermined width and a predetermined sectional area, the inner leads have the desired predetermined mechanical strength in the direction of thickness. Accordingly, it is possible to obtain a lead frame which is never crushed or deformed when wires are bonded to the inner leads. Further, since the inner leads are never twisted or deformed when working is made on the inner leads, wires can be surely connected to the inner leads, so that there is no possibility of generation of defective connection.

According to another aspect of the present invention, in the lead-frame producing method, inner leads are formed from a lead frame material through two or more times of working selected from etching working by a photolithography technique, press working, and a combination of etching and press working.

According to a further aspect of the present invention, in the lead-frame producing method, in order to form inner leads from a lead frame material, grooves are formed in the lead frame material in the opposite surfaces of the lead frame material through etching so that each pair of the grooves in opposition to each other communicate each other at the respective bottom portions of the grooves in pair.

According to a still further aspect of the present invention, in the lead-frame producing method, in order to form inner leads from a lead frame material, grooves are formed in one surface of the lead frame material through etching, and a slit is formed through etching or press working from a bottom portion of each of the grooves so that the slit reaches the other surface of the lead frame material.

According to another aspect of the present invention, in the lead-frame producing method, in order to form inner leads from a lead frame material, grooves are formed in the opposite surfaces of the lead frame material through etching so that respective bottom portions of each pair of the grooves in opposition to each other do not interfere with each other, and a slit is formed in a portion between the respective bottom portions of the grooves in each pair through etching or press working so that the grooves in each pair are connected to each other through the slit. According to a further aspect of the present invention, in the lead-frame material, grooves are formed in one surface of the lead frame material through press working so that the grooves have depth substantially equal to half of thickness of the lead frame material, and slits are formed through etching or press working so that the slots extend through the lead frame material from the respective bottoms of the grooves to reach the other surface of the lead frame material.

The above and other objects as well as advantageous features of the invention will become more clear from the following description taken in conjunction with the drawings.

DESCRIPTION OF THE PREFERRED EMBODIMENTS

In each of the embodiments of the lead-frame producing methods shown in FIGS. 6 through 18 respectively, a lead frame material 1, resists 2, and inner leads 3 are shown in section.

Figure 1:
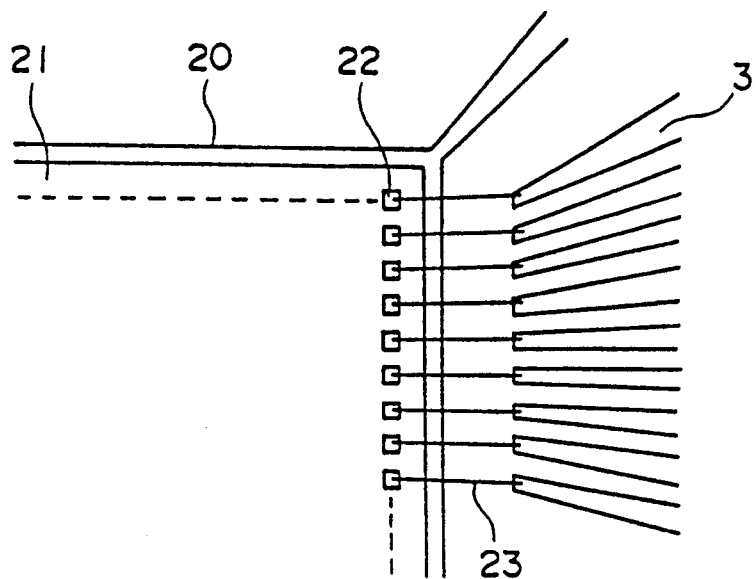
FIG. 1 is a typical view showing the state of connection between a semiconductor element and inner leads.
Figure 2:
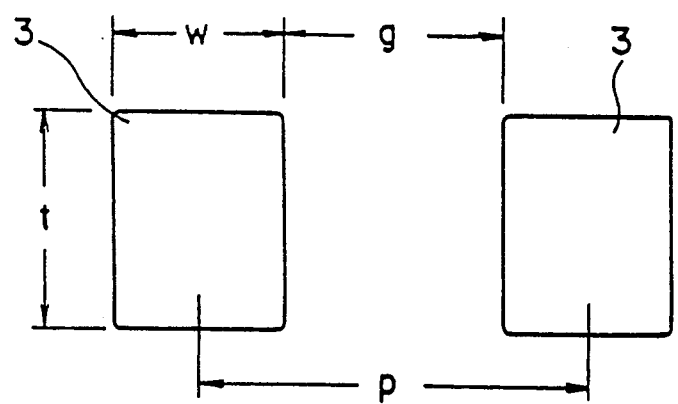
FIG. 2 is a typical view for explaining the dimensions of the inner leads.
Figure 3:
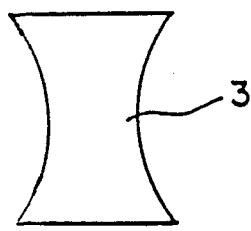
FIG. 3 is a sectional view of a conventional inner lead produced through etching.
Figure 4:
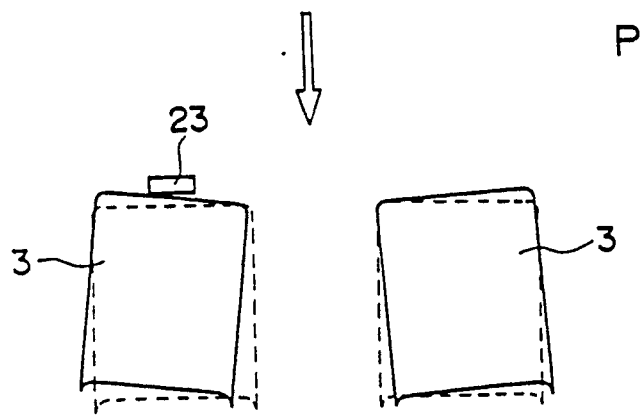
FIG. 4 is a sectional view of an example of conventional inner leads produced through press working.
Figure 5:
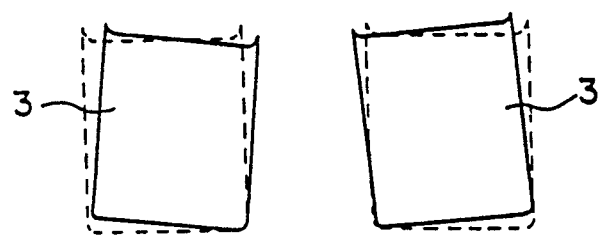
FIG. 5 is a sectional view of another example of conventional inner leads produced through press working.
Figure 6:
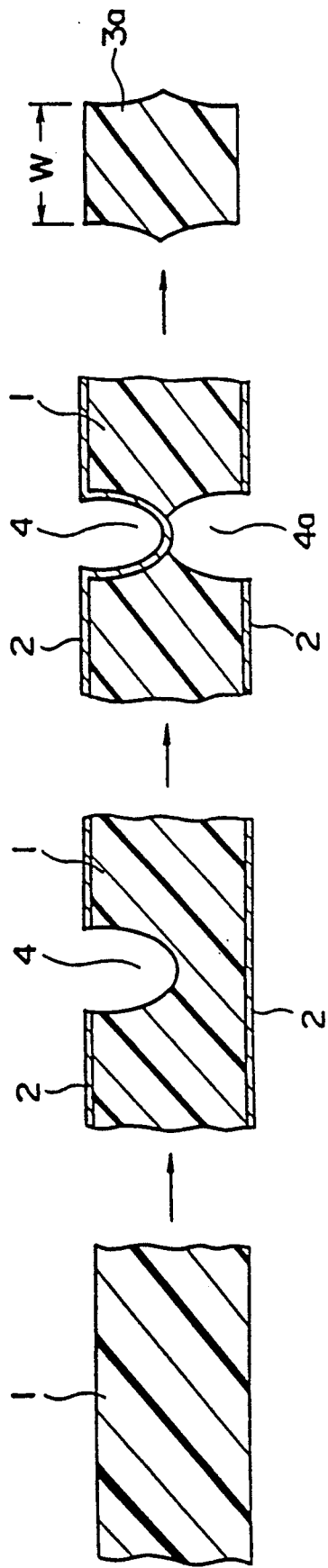
FIG. 6 is a view for explaining an embodiment of the lead-frame producing method according to the present invention.

In the embodiment shown in FIG. 6, resists 2 are applied onto the opposite surfaces of a lead frame material 1 first, and half-etching is carried out by a photolithographic technique to form a groove 4 having an arcuate or semi-oval section in the upper surface of the lead frame material 1 so that the groove 4 has an opened end portion the width of which is substantially in accordance with the above-mentioned gap g between the inner leads 3 and has a depth somewhat deeper than a half of the above-mentioned thickness t of the inner lead 3. Next, a resist 2 is applied onto the surface of the groove 4, and a groove 4a is formed through etching from the lower surface of the material 1 so that the groove 4a has the same size of that of the groove 4 and communicates with the groove 4. Thereafter, the resist 2 is removed.

The above operation is simultaneously performed at regular intervals, between grooves, each being equal to a predetermined width or the width w of each inner lead 3 so that a number of slits are formed in the lead frame material 1 to thereby obtain inner leads 3a each of which has a section slightly projected sidewards at central portions of the opposite side surfaces and having a width substantially equal to the predetermined with w.

Figure 7:
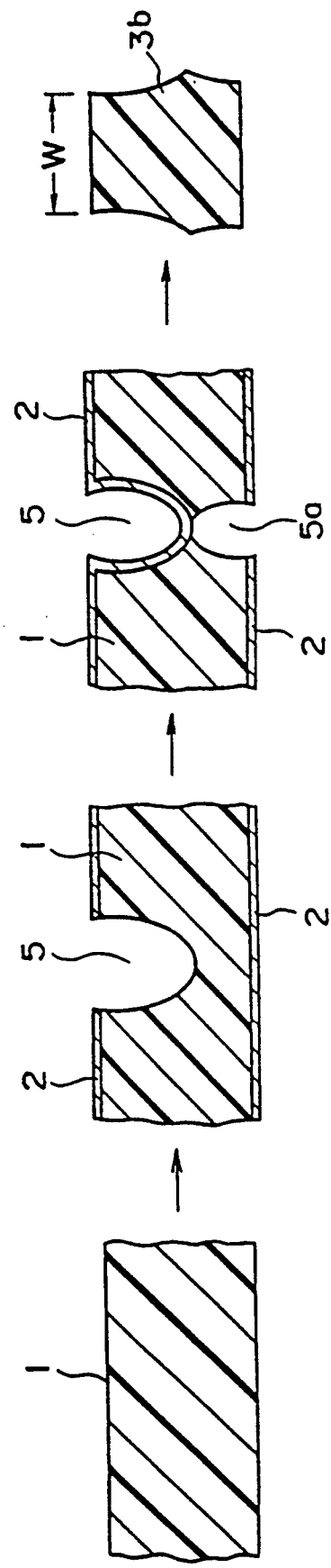
FIGS. 7 through 18 are views for explaining other embodiments of the lead-frame producing method according to the present invention respectively.

The producing press of embodiment shown in FIG. 7 is similar to that of the embodiment shown in FIG. 6. In this embodiment, however, a groove 5 having a depth of substantially two-thirds of the above-mentioned thickness t is formed through half-etching from an upper surface of a lead frame material 1 with its opposite surfaces coated with resists 2, and a groove 5a having a section smaller than that of the groove 5 is formed through half-etching from the lower surface of the lead frame material 1 so that the groove 5a continues to the groove 5. Accordingly, it si possible to obtain inner leads 3b each having a section having opposite side surfaces slightly projected sideward at their lower portions, having an upper-surface width substantially-equal to the above-mentioned predetermined width w, and having a lower surface width slightly larger than the upper-surface width.

Figure 8:
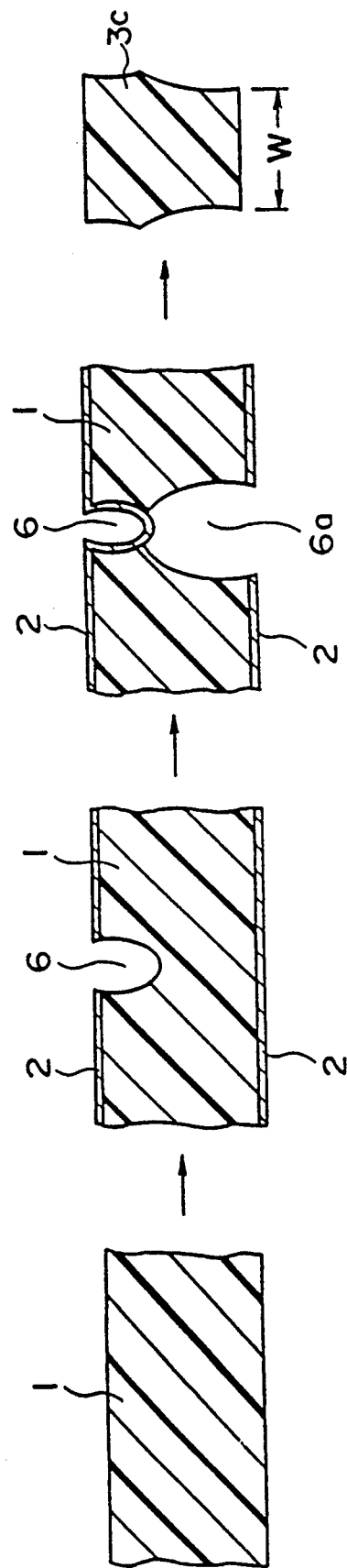

In the embodiment shown in FIG. 8, on the contrary to the embodiment shown in FIG. 7, small grooves 6 and large grooves 6a communicated with the small grooves 6 are formed, through half-etching, in a lead frame material 1 from its upper and lower surfaces respectively. In this embodiment, obtained inner leads 3c each having a section having opposite side surface slightly projected sideward at its upper portions respectively, having a lower-surface width substantially-equal to the predetermined width w, and an upper surface width slightly wider than the lower-surface width.

Figure 9:
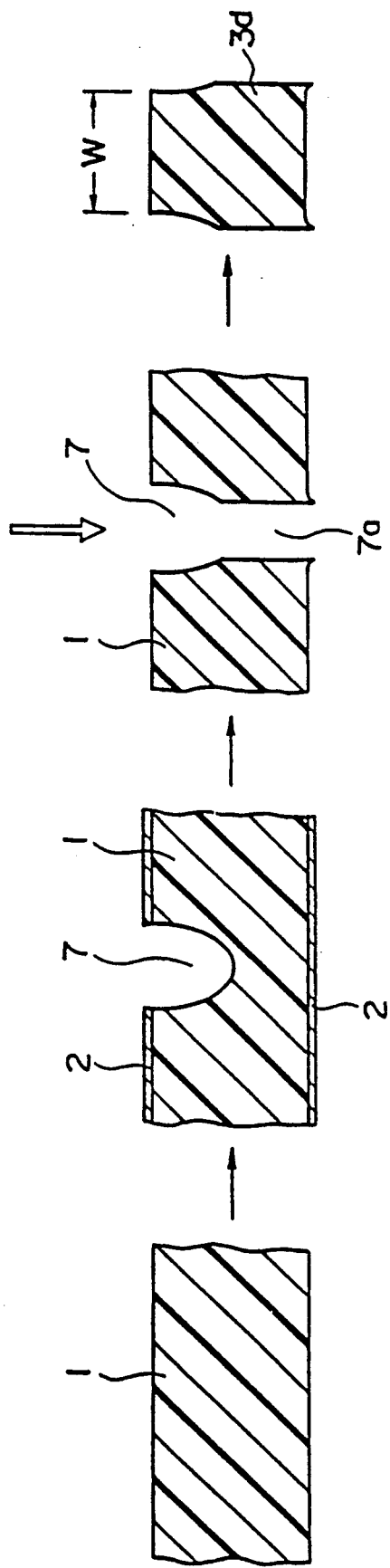
Figure 10:
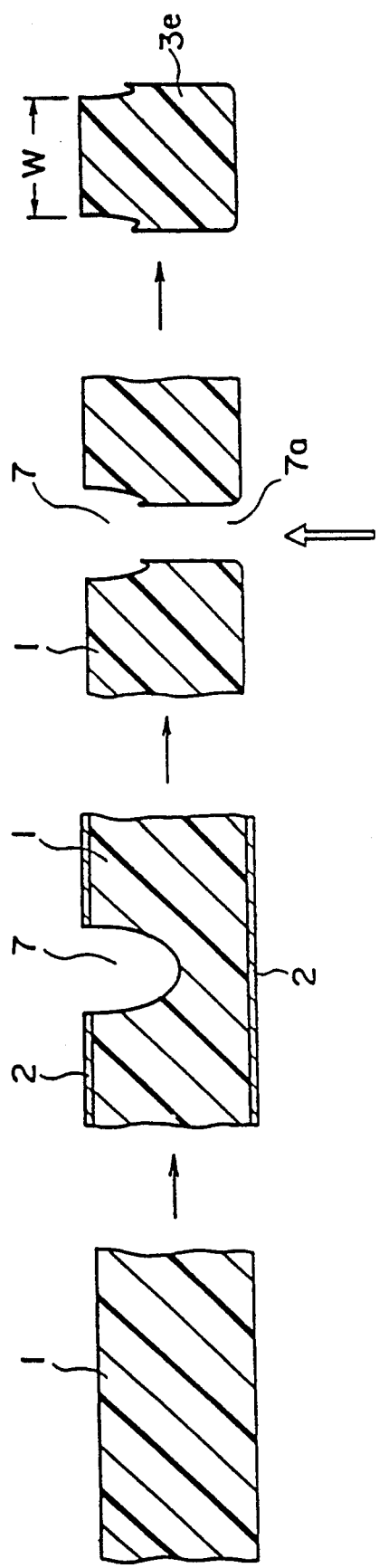

In each of the embodiments shown in FIGS. 9 and 10, similarly to the embodiment shown in FIG. 6, grooves 7 each having an opened end portion the width of which is substantially equal to the above-mentioned gap g between inner leads 3 and having a depth substantially equal to a half of the above-mentioned thickness t is formed through half-etching. In the embodiment of FIG. 9, the bottom portion of each groove 7 is punched from its top by pressing by use of a punch having a width narrower than the width of the opening portion of the groove 7 to thereby form a slit 7a. In the embodiment of FIG. 10, a lead frame material 1 is punched from its bottom side toward the bottom portion of each groove by use of a punch to thereby form a slit 7a. Accordingly, in the embodiments of FIGS. 9 and 10, inner leads 3d and 3e each having a section having an upper-surface width substantially equal to the above-mentioned predetermined width w and a lower-surface width slightly wider than the upper-surface width are obtained respectively.

Figure 11:
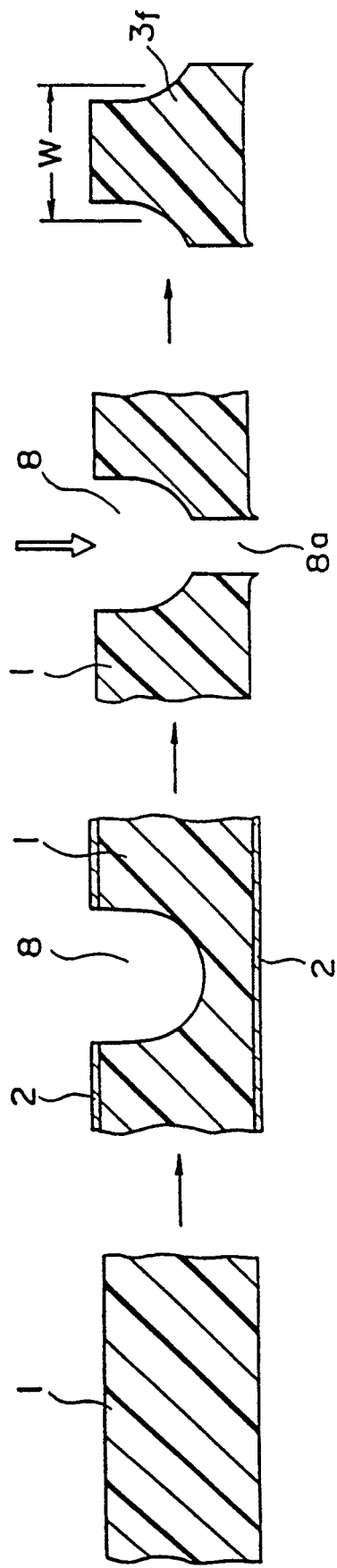
Figure 12:
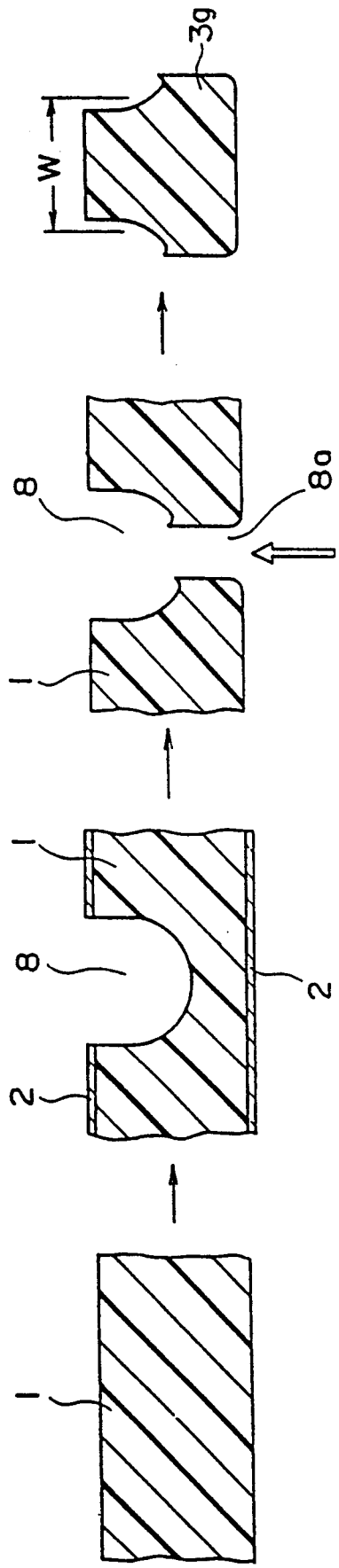

In each of the embodiments shown in FIGS. 11 and 12, similarly to the embodiments shown in FIGS. 9 and 10, grooves 8 are formed in the upper surface of a lead frame material 1. However, each groove 8 is formed so as to have an opened end portion the width of which is wider than the above-mentioned gap g between the inner leads 3 and a depth substantially equal to two-thirds of the thickness t of the lead frame material 1. In the embodiment shown in FIG. 11, the bottom portion of the groove 8 is punched from its top side by pressing by use of a punch narrower than the above-mentioned gap g between the inner leads 3 to thereby form a slit 8a. In the embodiment shown in FIG. 12, the lead frame material 1 is punched from its bottom side toward the bottom portion of the groove 8 by use of the same punch to thereby form a slit 8a.

In the above embodiments shown in FIGS. 11 and 12, respectively obtained are inner leads 3f and 3g each having a convex section having an upper-surface width slightly narrower than the above-mentioned predetermined width w and a lower-surface width slightly wider than the predetermined width w, and having a sectional area substantially equal to a predetermined sectional area.

Figure 13:
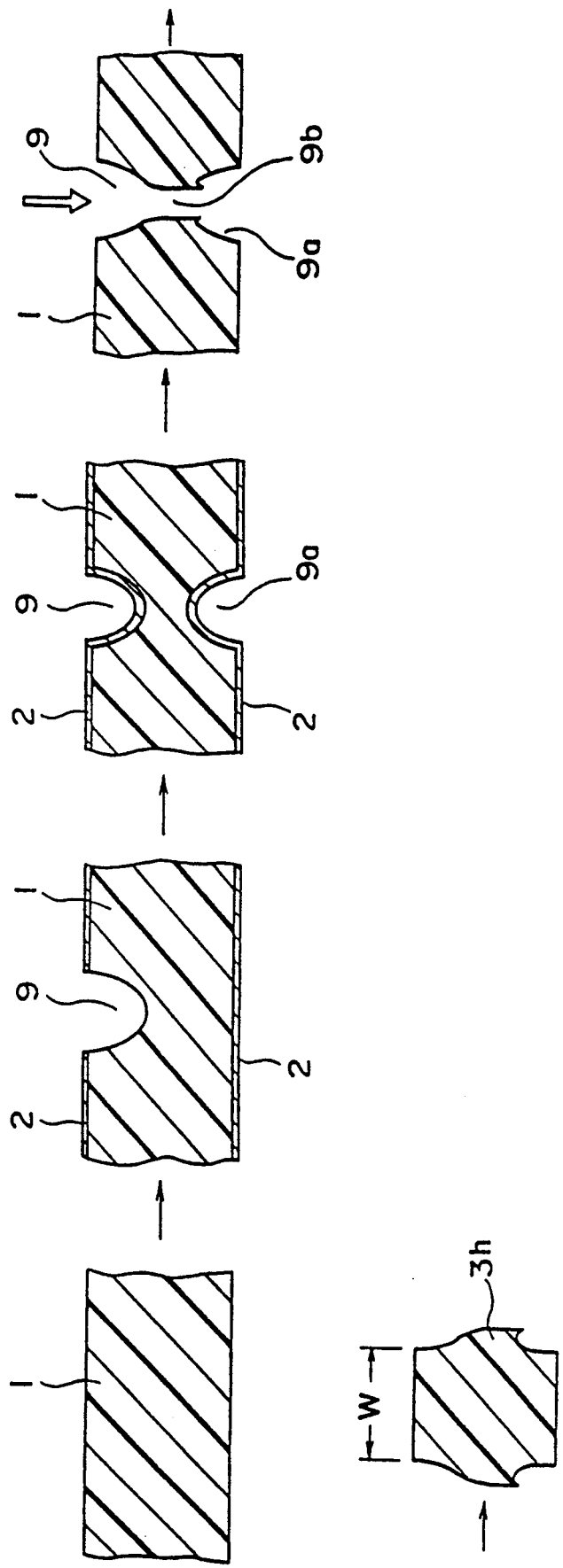

In the embodiment shown in FIG. 13, half etching is carried out in the opposite surfaces of a lead frame material 1 coated with resists 2 so as to form grooves 9 and 9a each having an opened end portion the width of which is substantially equal to the above-mentioned gap g between the inner leads 3 and each having a depth equal to about ne-third of the above-mentioned thickness t, and the portion between the grooves 9 and 9a is punched by use of a punch having a width narrower than that of the above-mentioned opened end portion to thereby form a slit 9b. In this embodiment, obtained are inner leads 3h each having a section in which the width at each of the upper and lower surfaces is substantially equal to the above-mentioned predetermined width w and in which the central portions of opposite side surfaces are slightly projected outward.

Figure 14:
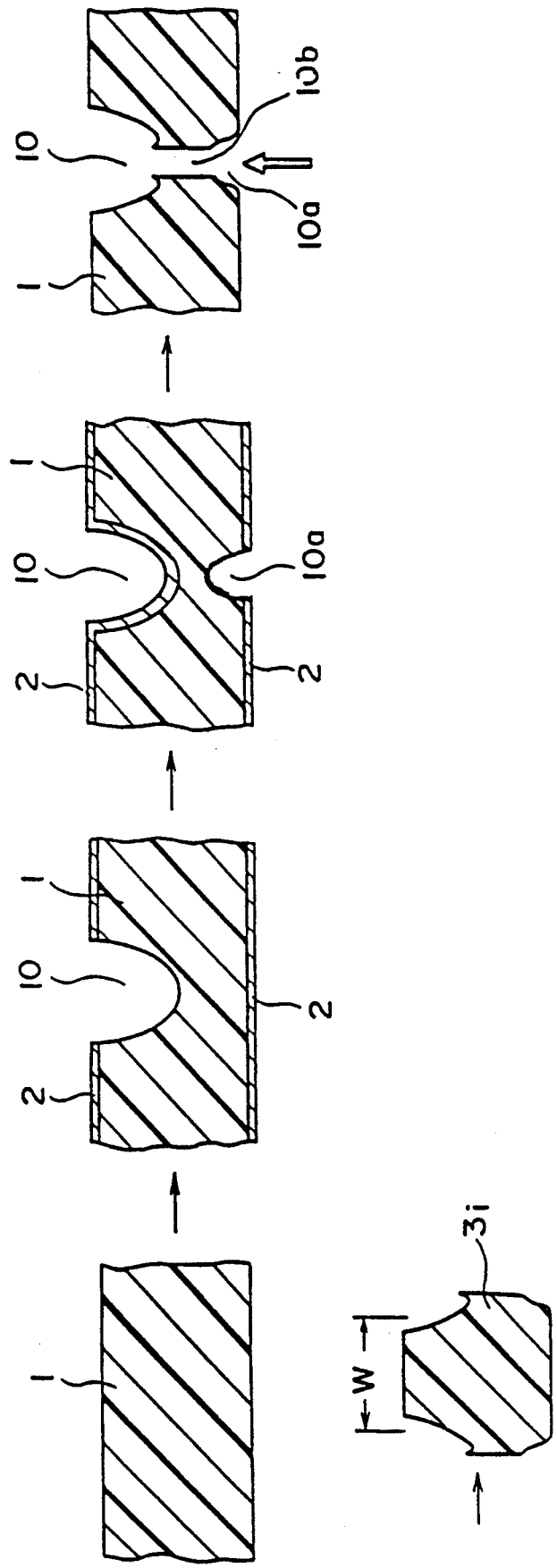
Figure 15:
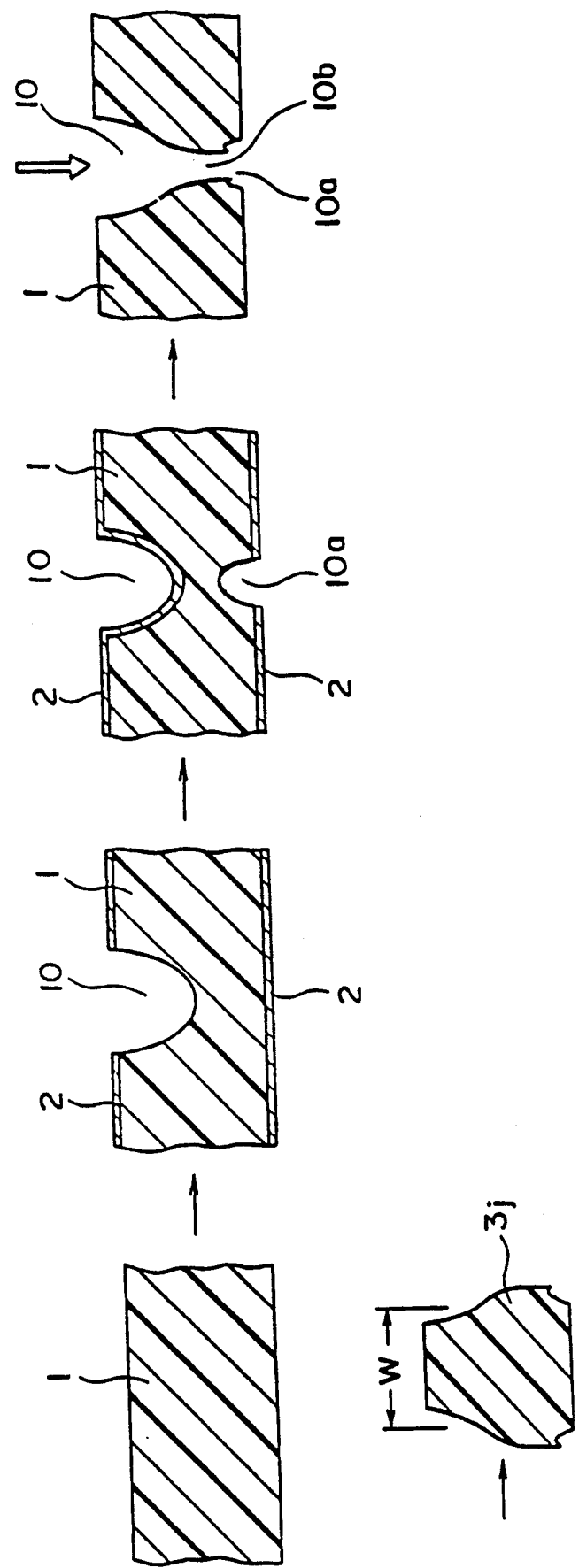

Further, in each of the embodiments shown in FIGS. 14 and 15, grooves 10 each having an opened end portion the width of which is wider than the above-mentioned gap g between the inner leads and a depth equal to about a half of the above-mentioned thickness t are formed in a lead frame material 1 from its upper surface through half-etching, and grooves 10a each having a width and a depth smaller than those of each groove 10 are formed in the lead frame material 1 from its lower surface through half-etching. In the embodiment shown in FIG. 14, the portion between each of the grooves 10 and the corresponding groove 10a is punched from the lower side by use of a punch having a width narrower than that of the opened end portion of the groove 10a to thereby form a slit 10b. In the embodiment shown in FIG. 15, the portion between the grooves 10 and 10a is punched from the upper side by use of the same punch as that of the embodiment of FIG. 14 to thereby form a slit 10b.

In the above cases, obtained are inner leads 3i and 3j each having a section in which an upper-surface width is slightly narrower than the above-mentioned predetermined width w, a lower-surface width is wider than the predetermined width w, and opposite side surfaces are slightly projected, and each having a sectional area substantially equal to a predetermined sectional area.

Figure 16:
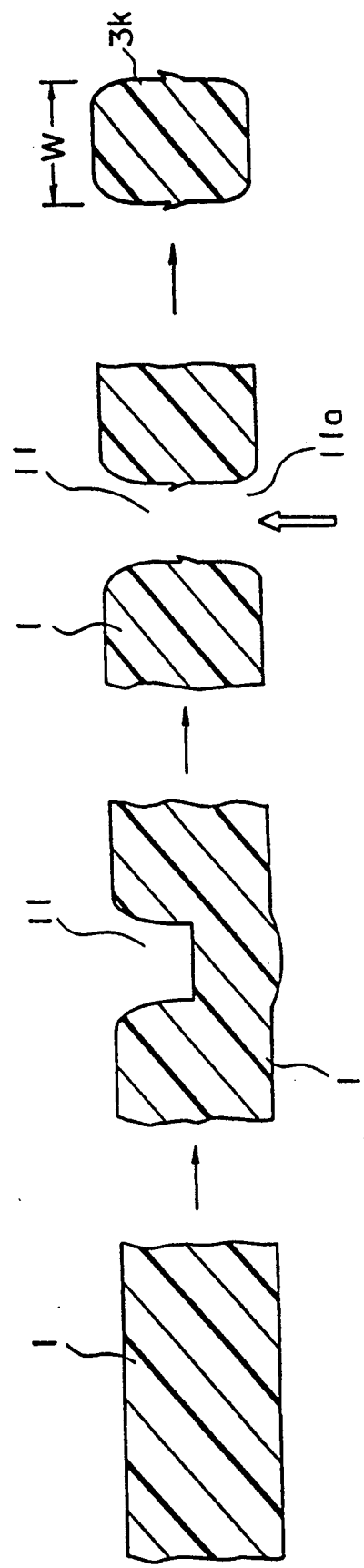

In the embodiment shown in FIG. 16, first, grooves 11 each having a depth which is substantially equal to a half of the thickness t of a lead frame material 1 is formed through press working in the lead frame material 1 from its upper surface by use of a punch having a width which is substantially equal to the above-mentioned gap g between the inner leads 3. Next, the bottom portion of each groove 11 is punched from the lower side by use of the punch of the same shape to thereby form a slit 11a. In this embodiment, obtained is inner leads 3k each having a rectangular section the width at each of upper and lower surfaces of which is equal to the above-mentioned predetermined width w. The bottom portion of each groove 11 may be punched from the upper side by use of the same punch.

Figure 17:
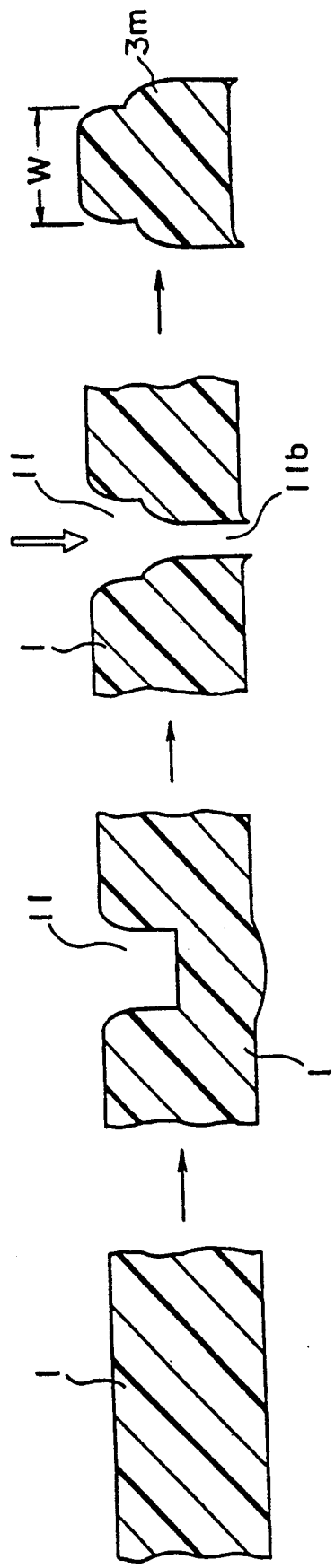
Figure 18:
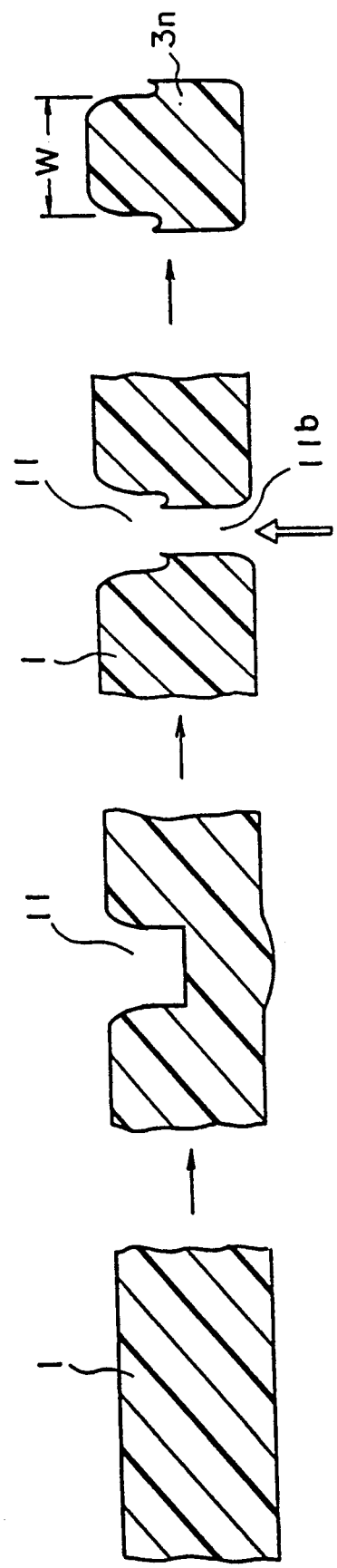

In each of the embodiments in FIGS. 17 and 18, the steps of forming grooves 11 through press working in a lead frame material 1 from its upper surface side is the same as that of the embodiment shown in FIG. 16. In the embodiment shown in FIG. 17, however, the bottom portion of each groove 11 is punched from the upper side by use of a punch having a width narrower than that of the groove 11 to thereby form a slit 11b. In the embodiment shown in FIG. 18, the bottom portion of each groove 11 is punched from the lower side by use of a punch having a width slightly wider than that of the punch used in the embodiment of FIG. 17 to thereby form a slit 11b. In the embodiments in FIG. 17 and 18, obtained are inner leads 3m and 3n each having a section in which the width at the upper surface is substantially equal to the above-mentioned predetermined width w and the width at the lower surface is slightly wider than the predetermined width w.

As described above, in the embodiments, the lead frame material is worked two or more times through etching, press working, or combination of etching and press working to thereby produce inner leads. Accordingly, it is possible to obtain inner leads each having a width and a sectional area which are substantially equal to a predetermined width and a predetermined sectional area, respectively.

Although the embodiments have been described by referring to FIGS. 6 through 18, the present invention is not limited to those illustrated embodiments, but suitable modifications can be made. For example, desired inner leads can be produced through etching, press working, or a suitable combination of etching and press working. Specifically, for example, the slits 7a, 8a, 9b, and 10b shown in FIGS. 9 through 15 may be formed through etching.

What is claimed is:

1. A method of forming a lead in a lead frame plate having first and second opposed surfaces comprising etching a pair of spaced apart first grooves each having a first depth in said first surface, said first grooves each having, at said first surface, a first width, etching a pair of spaced apart second grooves each having a depth less than said first depth in the second surface of said plate and in alignment with a respective first groove, said second grooves each having, at said second surface, a second width less than said first width, each said second groove having a bottom surface separated from a bottom surface of its respective first groove by a reduced thickness portion of said plate, and thereafter punching away said reduced thickness portion for interconnecting said respective first and second grooves and thereby forming a lead between said interconnected grooves, said lead having an axis of elongation, and the width of said lead at said first surface in a plane perpendicular to said axis being less than the width thereof at said second surface in said plane.

* * * * *